US006969570B1

(12) United States Patent
Kitson

(10) Patent No.: US 6,969,570 B1

(45) Date of Patent: Nov. 29, 2005

(54) SOLVENT RESISTANT IMAGEABLE ELEMENT

(75) Inventor: Paul Kitson, Evans, CO (US)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 0 days.

(21) Appl. No.: 10/973,799

(22) Filed: Oct. 26, 2004

(51) Int. Cl.$^7$ .......................... G03F 7/039; G03F 7/11; G03F 7/30

(52) U.S. Cl. ............................ 430/15; 430/17; 430/18; 430/270.1; 430/271.1; 430/302; 430/330; 430/905; 430/909; 430/910; 430/964

(58) Field of Search .......................... 430/270.1, 271.1, 430/302, 330, 909, 905, 910, 964, 15, 17, 430/18

(56) References Cited

U.S. PATENT DOCUMENTS

| | | | |
|---|---|---|---|
| 6,103,445 | A | 8/2000 | Willson et al. |
| 6,143,464 | A | 11/2000 | Kawauchi |
| 6,294,311 | B1 | 9/2001 | Shimazu et al. |
| 6,312,868 | B1 | 11/2001 | Kong et al. |
| 6,358,669 | B1 | 3/2002 | Savariar-Hauck et al. |
| 6,475,698 | B2 | 11/2002 | Monk et al. |
| 6,525,152 | B1 | 2/2003 | Jarek |
| 6,593,441 | B2 | 7/2003 | Jung et al. |
| 6,599,677 | B2 | 7/2003 | Szmanda et al. |
| 6,632,903 | B2 | 10/2003 | Jung et al. |
| 6,777,157 | B1 | 8/2004 | Barclay et al. |
| 2004/0137366 | A1 | 7/2004 | Kawauchi et al. |

FOREIGN PATENT DOCUMENTS

| | | |
|---|---|---|
| JP | 2000-330265 | 11/2000 |

OTHER PUBLICATIONS

Jeffery Byers, Kyle Patterson, Sungseo Cho, Martin McCallum, and C. Grant Willson, Recent advancements in cycloolefin based resists for ArF lithography, *J. Photopolymer Science and Technology, 11*(3), 465-474 (1998).

Anthony J. Pasquale, Robert D. Allen, and Timothy E. Long, Fundamental Investigations of the Free Radical Copolymerization and Terpolymerization of Maleic Anhydride, Norbornene, and Norbornene tert-Butyl Ester: In-Situ Mid-Infrared Spectroscopic Analysis, *Macromolecules, 34*(23) 8064-8071 (2001).

Katsuji Douki, Toru Kajita, and Tsutomu Shimokawa, High Performance 193-nm Positive Resist Using Alternating Polymer System of Functionalized Cyclic Olefins/Maleic Anhydride, *Proceedings of the SPIE, 3999*, 1128-1135 (2000).

A.N. Medina, A.T. Reddy, J.M. Davidson, F.M. Houlihan, and O. Nalamasu, Polymerization Kinetics of a Cycloolefin-Based ArF Binder Resin, Abstracts of Papers, 221$^{st}$ Meeting of the American Chemical Society, San Diego, CA, Apr. 1-5, 2001.

*Primary Examiner*—Richard L. Schilling

(74) *Attorney, Agent, or Firm*—Ratner Prestia

(57) ABSTRACT

Thermally imageable elements useful as lithographic printing plate precursors are disclosed. The elements comprise a substrate, an underlayer over the substrate, and a top layer over the underlayer. The top layer comprises a co-polymer that comprises, in polymerized form, norbornene or a norbornene derivative. The resulting lithographic printing plates have good resistance to pressroom chemicals.

22 Claims, No Drawings

SOLVENT RESISTANT IMAGEABLE ELEMENT

FIELD OF THE INVENTION

The invention relates to lithographic printing. In particular, this invention relates to imageable elements useful as lithographic printing plate precursors that have good solvent resistance.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed by a suitable developer, revealing the underlying hydrophilic surface of the substrate. If the imaged regions are removed, the precursor is positive working. Conversely, if the unimaged regions are removed, the precursor is negative working. In each instance, the regions of the imageable layer (i.e., the image areas) that remain are ink-receptive, and the regions of the hydrophilic surface revealed by the developing process accept water and aqueous solutions, typically a fountain solution, and repel ink.

Conventional imaging of the imageable element with ultraviolet and/or visible radiation was carried out through a mask, which has clear and opaque regions. Imaging takes place in the regions under the clear regions of the mask but does not occur in the regions under the opaque regions. However, direct digital imaging, which obviates the need for imaging through a mask, is becoming increasingly important in the printing industry. Imageable elements for the preparation of lithographic printing plates have been developed for use with infrared lasers. Thermally imageable, single layer elements are disclosed in, for example, West, U.S. Pat. No. 6,090,532; Parsons, U.S. Pat. No. 6,280,899; McCullough, U.S. Pat. No. 6,596,469; and WO99/21715, the disclosures of which are all incorporated herein by reference. Thermally imageable, multi-layer elements are disclosed, for example, in Shimazu, U.S. Pat. No. 6,294,311, U.S. Pat. No. 6,352,812, and U.S. Pat. No. 6,593,055; Patel, U.S. Pat. No. 6,352,811; Savariar-Hauck, U.S. Pat. No. 6,358,669, and U.S. Pat. No. 6,528,228; and Kitson, 2004/0067432 A1; the disclosures of which are all incorporated herein by reference.

In use, a lithographic printing plate comes in contact with fountain solution. In addition, the printing plate is often subjected to aggressive blanket washes, such as a "UV wash" to remove ultraviolet curable inks. However, many of these systems have limited resistance to either fountain solution and/or aggressive blanket washes. Thus, a need exists for thermally imageable elements, useful as a lithographic printing plate precursors, that have resistance to these solvents.

SUMMARY OF THE INVENTION

In one aspect, the invention is an imageable element that has excellent chemical resistance. The imageable element comprises:

a substrate, an underlayer over the substrate, and a top layer over the underlayer; in which:

the element comprises a photothermal conversion material;

the top layer is ink receptive;

before thermal imaging, the top layer is not removable by an alkaline developer;

after thermal imaging to form imaged regions in the top layer, the imaged regions are removable by the alkaline developer;

the underlayer is removable by the alkaline developer, and the top layer comprises a co-polymer selected from the group consisting of co-polymers that comprise, in polymerized form, a monomer of group (a) and a monomer of group (b), in which:

the monomer of group (a) is selected from the group consisting of:

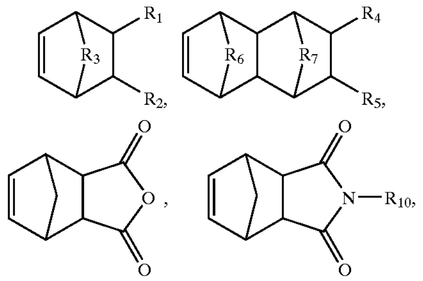

and mixtures thereof;

the monomer of group (b) is selected from the group consisting of:

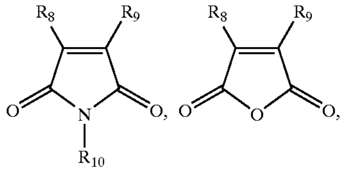

acrylonitrile, methacrylonitrile, styrene, hydroxystyrene, $CH(R_{11})CH(CO_2R_{12})$, $CH(R_{11})CH(CON(R_{12})_2)$, $CH_2CH(OR_{12})$, and mixtures thereof;

$R_1$, $R_2$, $R_4$, and $R_5$ are each independently hydrogen, phenyl, substituted phenyl, halogen, alkyl of 1 to 6 carbon atoms, alkoxyl of 1 to 6 carbon atoms, acyl of 1 to 7 carbon atoms, acyloxy of 1 to 7 carbon atoms, carboalkoxy of 1 to 7 carbon atoms, or a mixture thereof;

$R_3$, $R_6$, and $R_7$ are each —$CH_2$—;

each $R_8$, and $R_9$ is each independently hydrogen or methyl, or a mixture thereof;

each $R_{10}$ is hydrogen, hydroxyl, alkyl of 1 to 6 carbon atoms, phenyl, substituted phenyl, benzyl, or a mixture thereof; and each $R_{11}$ is hydrogen, methyl, or a mixture thereof;

each $R_{12}$ is hydrogen, alkyl of 1 to 6 carbon atoms, phenyl, substituted phenyl, or a mixture thereof; and the co-polymer comprises at least about 15 mol % of the monomer of group (a), and at least about 10 mol % of the monomer of group (b).

In another aspect, the invention is a method for forming an image by thermally imaging and developing an imageable element that comprises a top layer that comprises the co-polymer over a substrate. In another aspect, the invention is an image formed by imaging and developing the imageable element.

DETAILED DESCRIPTION OF THE INVENTION

Unless the context indicates otherwise, in the specification and claims, the terms polymeric material, co-polymer, monomer of group (a), monomer of group (b), added polymer, photothermal conversion material, surfactant, and similar terms also include mixtures of such materials. Unless otherwise specified, all percentages are percentages by weight and all temperatures are in degrees Centigrade (degrees Celsius). Thermal imaging refers to imaging with a hot body, such as a thermal head, or with infrared radiation.

Multilayer Imageable Element

In one aspect, the invention is a multilayer imageable element comprising a substrate, an underlayer over the substrate, and a top layer over the underlayer. The element also comprises a photothermal conversion material. The top layer is ink receptive and, preferably, substantially free of the photothermal conversion material. Before thermal imaging, the top layer is not removable by an alkaline developer, but after thermal imaging the imaged regions of the top layer are removable by the developer. The underlayer is removable by the developer.

Top Layer

The top layer comprises a co-polymer or a mixture of co-polymers, which comprise, in polymerized form, a monomer from group (a) and a monomer from group (b). Although small amounts of other monomers may be present in the co-polymer, they are typically not required so that the co-polymer consists essentially of the monomer from group (a) and the monomer from group (b).

The co-polymer typically consists essentially of or consists of, in polymerized form, the monomer from group (a) and the monomer from group (b). The co-polymer comprises at least about 15 mol % of the monomer of group (a) and at least about 10 mol % of the monomer of group (b). The co-polymer typically comprises about 15 mol % to about 90 mol % of the monomer of group (a), and about 10 mol % to about 85 mol %, preferably 15 about mol % to about 50 mol %, of the monomer of group (b). When electron deficient olefins, such as maleic anhydride or a maleimide are used as the monomer of group (b), 1:1 alternating co-polymers (i.e., 50 mol % of the monomer of group (a) and 50 mol % of the monomer of group (b)) are typically produced.

The top layer typically comprises at least 70 wt %, more typically at least 90 wt %, and even more typically at least 95 wt % of the co-polymer. When the top layer does not comprise the photothermal conversion material, the top layer typically comprises at least 98 to 99 wt % of the co-polymer.

The monomer of group (a) is norbornene or a norbornene derivative selected from the group consisting of:

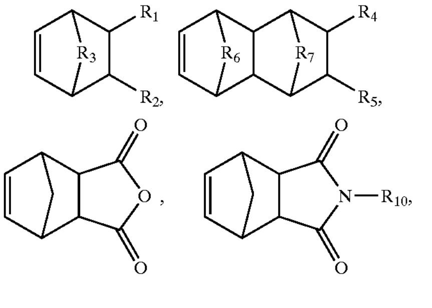

and mixtures thereof.

The monomer of group (b) is selected from the group consisting of:

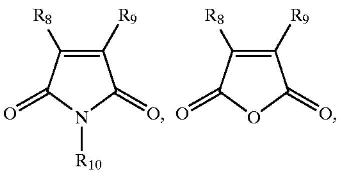

acrylonitrile, methacrylonitrile, styrene, hydroxystyrene, $CH(R_{11})CH(CO_2R_{12})$, $CH(R_{11})CH(CON(R_{12})_2)$, $CH_2CH(OR_{12})$, and mixtures thereof.

$R_1$, $R_2$, $R_4$, and $R_5$ are each independently hydrogen, phenyl, substituted phenyl, halogen, alkyl of 1 to 6 carbon atoms, alkoxyl of 1 to 6 carbon atoms, acyl of 1 to 7 carbon atoms, acyloxy of 1 to 7 carbon atoms, carboalkoxy of 1 to 7 carbon atoms, or a mixture thereof. Substituted phenyl groups include, for example, 2-methylphenyl, 3-methylphenyl, 4-methylphenyl, 4-t-butylphenyl, 4-methoxyphenyl, 3-ethoxyphenyl, 4-cyanophenyl, 4-chlorophenyl, 4-fluorophenyl, 4-acetoxyphenyl, 4-carboxyphenyl, 4-carboxymethylphenyl, 4-carboxyethylphenyl, 3,5-dichlorophenyl, and 2,4,6-trimethylphenyl. Halogen includes fluoro (F), chloro (Cl), and bromo (Br). Alkyl groups of one to six carbon atoms, include, for example, methyl, ethyl, n-propyl, iso-propyl, n-butyl, sec-butyl, iso-butyl, t-butyl, n-pentyl, iso-pentyl, neopentyl, n-hexyl, iso-hexyl, 1,1-dimethyl-butyl, 2,2-dimethyl-butyl, cyclopropyl, cyclobutyl, cyclopentyl, methylcyclopentyl, and cyclohexyl. Alkoxy groups of one to six carbon atoms are —OR groups in which R is an alkyl group of 1 to 6 carbon atoms, such as are listed above. Examples are methoxy, ethoxy, n-propoxy, iso-propoxy, n-butoxy, and t-butoxy. Acyl groups of 1 to 7 carbon atoms are —C(O)R groups in which R is an alkyl group of 1 to 6 carbon atoms, such as are listed above. Examples are $CH_3CO$— (acetyl), $CH_3CH_2CO$—, $CH_3(CH_2)_2CO$—, $CH_3(CH_2)_3CO$—, $(CH_3)_3CCO$—, and $(CH_3)_3CCH_2CO$—. Acyloxy groups of 1 to 7 carbon atoms are —OC(O)R groups in which R is an alkyl group of 1 to 6 carbon atoms, such as are listed above. Examples are $H_3CC(O)O$— (acetyloxy), $CH_3CH_2C(O)O$—, $CH_3(CH_2)_2C(O)O$—, $CH_3(CH_2)_3C(O)O$—, $(CH_3)_3CC(O)O$—, and $(CH_3)_3CCH_2C(O)O$—. Carboalkoxy groups of 1 to 7 carbon atoms are —$CO_2R$ groups in which R is an alkyl group of 1 to 6 carbon atoms, such as are listed above. Examples are —$CO_2CH_3$, (carbomethoxy), —$CO_2CH_2CH_3$, —$CO_2(CH_2)_2CH_3$, —$CO_2(CH_2)_3CH_3$, —$CO_2C(CH_3)_3$ (carbo-t-butoxy), —$CO_2CH_2C(CH_3)_3$, —$CO_2(CH_2)_4CH_3$, and —$CO_2(CH_2)_5CH_3$.

$R_3$, $R_6$, and $R_7$ are each —$CH_2$—.

Each $R_8$ and $R_9$ is each independently hydrogen or methyl, or a mixture thereof, typically hydrogen.

$R_{10}$ is hydrogen, hydroxyl, alkyl of 1 to 6 carbon atoms, phenyl, substituted phenyl, benzyl, or a mixture thereof. Examples of alkyl of 1 to 6 carbon atoms and of substituted phenyl groups are given above. $R_{10}$ is typically hydrogen, hydroxyl, methyl, phenyl, cyclohexyl, benzyl, or a mixture thereof.

Each $R_{11}$ is independently hydrogen, methyl, or a mixture thereof.

Each $R_{12}$ is independently hydrogen, alkyl of 1 to 6 carbon atoms, phenyl or a mixture thereof, typically hydrogen, methyl, or a mixture thereof.

Preparation of the Co-Polymers

Norbornene and some substituted norbornenes, monomers of group (a), are commercially available. As will be apparent to those skilled in the art, certain monomers of group (a) may be prepared by the Diels-Alder reaction. Many substituted norbornenes may be prepared by the Diels-Alder reaction of cyclopentadiene with an appropriate olefin. Cyclopentadiene is typically prepared by thermally cracking the cyclopentadiene dimer. The t-butyl 5-norbornene-2-carboxylate, for example, may be prepared by the Diels-Alder reaction of cyclopentadiene with t-butyl acrylate. The corresponding 2-hydroxypropyl ester may be prepared by the Diels-Alder reaction of cyclopentadiene with 2-hydroxypropyl acrylate. The preparation of substituted norbornenes, and their conversion to co-polymers, is disclosed, for example, in Jung, U.S. Pat. No. 6,593,441; Jung, U.S. Pat. No. 6,632,903; Willson, U.S. Pat. No. 6,103,445; A. J. Pasquale, et al, *Macromolecules,* 34, 8064–8071 (2001), and J. Byers, et al., *J. Photopolym. Sci. Technol.,* 11(3), 465–474 (1998), the disclosures of which are incorporated herein by reference.

The co-polymers may be prepared by free radical polymerization. In a typical preparation, a group (a) monomer and a group (b) monomer are co-polymerized. Free radical polymerization is well known to those skilled in the art and is described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Chain transfer agents, such as dodecyl mercaptan, may be used to control the molecular weight of the compound. When electron deficient olefins, such as maleic anhydride or a maleimide are used as the group (b) monomer, 1:1 alternating co-polymers are typically produced. Suitable solvents for free radical polymerization include liquids that are inert to the reactants and which will not otherwise adversely affect the reaction, for example, water; esters such as ethyl acetate and butyl acetate; ketones such as methyl ethyl ketone, methyl isobutyl ketone, methyl propyl ketone, and acetone; alcohols such as methanol, ethanol, isopropyl, n-propanol, 2-methoxyethanol (Methyl CELLOSOLVE®), n-butanol; ethers such as dioxane and tetrahydrofuran; and mixtures thereof.

Monomers of group (a) include, for example, norbornene (bicyclo[2.2.1]hept-2-ene) and its derivatives, such as methyl 5-norbornene-2-carboxylate, t-butyl 5-norbornene-2-carboxylate, and other esters of 5-norbornene-2-carboxylic acid; cis-5-norbornene-endo-2,3-dicarboxylic anhydride and the corresponding imides, such as the N-methyl, N-hydroxyl, N-phenyl, N-cyclohexyl, and the N-benzyl imides; tetracyclododecene (tetracyclo[4.4.0.$1^{2,5}$.$1^{7,10}$] dodec-3-ene) and its derivatives, such as the esters of (tetracyclo[4.4.0.$1^{2,5}$.$1^{7,10}$]dodec-3-ene-8-carboxylic acid, for example methyl(tetracyclo[4.4.0.$1^{2,5}$.$1^{7,10}$]dodec-3-ene)-8-carboxylate, ethyl (tetracyclo[4.4.0.$1^{2,5}$.$1^{7,10}$]-dodec-3-ene)-8-carboxylate, and t-butyl (tetracyclo-[4.4.0.$1^{2,5}1^{7,10}$]dodec-3-ene)-8-carboxylate; (tetracyclo-[4.4.0.$1^{2,5}$.$1^{7,10}$]dodec-3-ene-endo-8,9-dicarboxylic acid and its corresponding imides, such as the N-methyl, N-hydroxyl, N-phenyl, N-cyclohexyl, and the N-benzyl imides; and mixtures thereof.

Monomers of group (b) include, for example, acrylonitrile, methacrylonitrile, hydroxystyrene, acrylic acid esters such as methyl acrylate, ethyl acrylate, propyl acrylate, butyl acrylate, and phenyl acrylate; methacrylic acid esters such as methyl methacrylate, ethyl methacrylate, propyl methacrylate, butyl methacrylate, and phenyl methacrylate; methacrylamides and acrylamides, such as methacrylamide, acrylamide, N,N-dimethyl acrylamide, N,N-dimethyl methacrylamide, and the acrylamide and methacrylamide of p-aminobenzoic acid; maleic anhydride; maleic acid imides, such as N-phenylmaleimide, N-cyclohexylmaleimide, N-benzylmaleimide, N-methylmaleimide, N-hydroxylmaleimide; vinyl ethers, such as methyl vinyl ether and ethyl vinyl ether; and mixtures thereof.

One or more other added polymers may also be present in the top layer. When present, the added polymer comprises about 0.1 wt % to about 50 wt %, preferably about 1 wt % to about 20 wt % of the top layer. The added polymer is typically a phenolic resin, such as a novolac resin, a resole resin, or a polyvinyl phenol. When present the preferred added polymers are novolac resins.

Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Solvent soluble novolac resins having a weight average molecular weight of at least 10,000; solvent soluble m-cresol/p-cresol novolac resins that comprises at least 10 mol % p-cresol and have a weight average molecular weight of at least 8,000; and mixtures thereof may be particularly useful.

The top layer may also comprise other ingredients such as dyes and surfactants that are conventional ingredients of imageable elements. A surfactant, such as a fluorinated surfactant or a polyethoxylated dimethylpolysiloxane co-polymer, or a mixture of surfactants may be present to help disperse the other ingredients in a coating solvent and/or to act as a coating aid. A dye may be present to aid in the visual inspection of the imaged and/or developed element. Printout dyes distinguish the imaged regions from the unimaged regions during processing. Contrast dyes distinguish the unimaged regions from the imaged regions in the developed imageable element i.e., the resulting lithographic printing plate.

Underlayer

When present, the underlayer is between the top layer and the substrate. It is over the substrate and, typically, on the substrate. The underlayer comprises a polymeric material that is removable by the developer, and preferably soluble in the developer. In addition, the polymeric material is preferably insoluble in the solvent used to coat the top layer so that the top layer can be coated over the underlayer without dissolving the underlayer. Other ingredients, additional polymers, photothermal conversion materials, and surfactants, may also be present in the underlayer. Useful polymeric materials include carboxy functional acrylics, vinyl acetate/crotonate/vinyl neodecanoate co-polymers, styrene maleic anhydride copolymers, phenolic resins, maleated wood rosin, and mixtures thereof. Underlayers that provide resistance both to fountain solution and aggressive washes are disclosed in Shimazu, U.S. Pat. No. 6,294,311, incorporated herein by reference.

Particularly useful polymeric materials are polyvinylacetals and co-polymers that comprise, in polymerized form, N-substituted maleimides, especially N-phenylmaleimide; methacrylamides, especially methacrylamide; and acrylic and/or methacrylic acid, especially methacrylic acid. The preferred polymeric materials of this type are co-polymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. These polymeric materials are soluble in a methyl lactate/methanol/dioxolane (15:42.5:42.5 wt %) mixture, which can be used as the coating solvent for the underlayer. However, they are poorly soluble in solvents such as acetone and toluene, which can be used as solvents to coat the top layer over the underlayer without dissolving the underlayer. The bakable underlayers disclosed in U.S. patent application Ser. No. 10/641,888, filed Aug. 14, 2003; U.S. patent application Ser. No. 10/820,546, filed Apr. 8, 2004; and U.S. patent application Ser. No. 10/681,701, filed Oct. 8, 2003; the disclosures of which are all incorporated herein by reference, may also be used.

The underlayer may also comprise one or more other polymeric materials, provided addition of these polymeric materials does not adversely affect the chemical resistance and solubility properties of the underlayer. Preferred other polymeric materials, when present, are novolac resins, which may be added to improve the run length of the printing member by a post-development bake process.

Photothermal Conversion Materials

Imageable elements that are to be imaged with infrared radiation typically comprise an infrared absorber, known as a photothermal conversion material. Photothermal conversion materials absorb radiation and convert it to heat. The photothermal conversion material may be present in the top layer, in the underlayer and/or in a separate absorber layer between the top layer and the underlayer. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include dyes and pigments. Typical pigments include, for example, carbon black, Heliogen Green, Nigrosine Base, iron (III) oxide, manganese oxide, Prussian Blue, and Paris blue. The size of the pigment particles should not be more than the thickness of the layer that contains the pigment. Preferably, the size of the particles will be half the thickness of the layer or less.

The photothermal conversion material may be a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyryloarylidene and bis(chalcogenopyrylo)polymethine, oxyindolizine, pyrazoline azo, and oxazine classes. Absorbing dyes are disclosed in numerous publications, for example, Nagasaka, EP 0,823,327; DeBoer, U.S. Pat. No. 4,973,572; Jandrue, U.S. Pat. No. 5,244,771; Patel, U.S. Pat. No. 5,208,135; and Chapman, U.S. Pat. No. 5,401,618. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epolite), SpectraIR 830A and SpectraIR 840A (Spectra Colors), as well as the IR dye whose structures is shown below, and IR Dye A and IR Dye B, whose structures are shown below.

IR Dye A

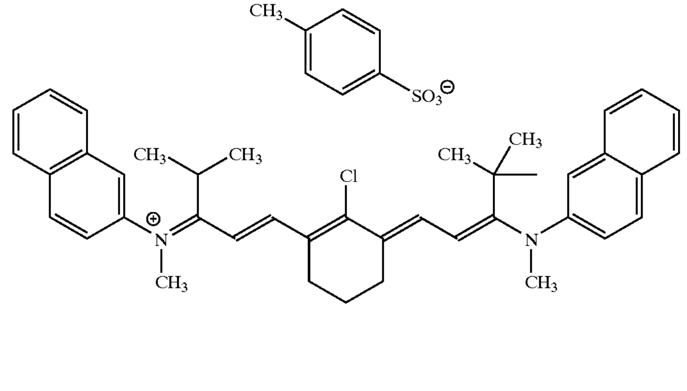

-continued

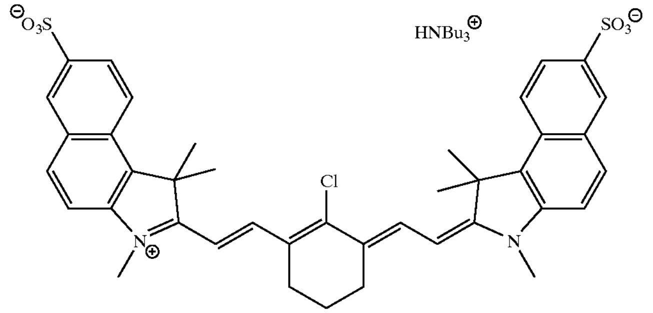

IR Dye B

Water-soluble photothermal conversion materials include, for example, cyanine dyes which one or more sulfate and/or sulfonate groups. Other infrared absorbing cyanine anions that contain two to four sulfonate groups are disclosed, for example, in West, U.S. Pat. No. 5,107,063; Pearce, U.S. Pat. No. 5,972,838; Chapman, U.S. Pat. No. 6,187,502; Fabricius, U.S. Pat. No. 5,330,884; and Japanese Laid Open Application No. 63-033477. The preparation of cyanine dyes with polysulfonate anions is disclosed, for example, in U.S. patent application Ser. No. 10/722,257, filed Nov. 25, 2003. The preparation of N-alkyl sulfate cyanine compounds is disclosed, for example, in U.S. patent application Ser. No. 10/736,364, filed Dec. 15, 2003.

The amount of photothermal conversion present in the element is generally sufficient to provide an optical density of at least 0.05, and preferably, an optical density of from about 0.5 to at least about 2 to 3 at the imaging wavelength. As is well known to those skilled in the art, the amount of compound required to produce a particular optical density at a particular wavelength can be determined using Beer's law. Although the amount present will depend on the compound or compounds chosen, when the photothermal conversion material is only present in the underlayer or in the top layer, it typically comprises about 0.2 wt % to about 8 wt %, more typically about 0.5 wt % to about 4 wt % of the layer.

Other Layers

The photothermal conversion material may be present in a separate absorber layer. When an absorber layer is present, it is between the top layer and the underlayer, or if the underlayer is not present, between the top layer and the substrate. The absorber layer preferably consists essentially of the photothermal conversion material and, optionally, a surfactant. It may be possible to use less of the photothermal conversion material if it is present in a separate absorber layer. The absorber layer preferably has a thickness sufficient to absorb at least 90%, preferably at least 99%, of the imaging radiation. Typically, the absorber layer has a coating weight of about 0.02 g/m$^2$ to about 2 g/m$^2$, preferably about 0.05 g/m$^2$ to about 1.5 g/m$^2$. Elements that comprise an absorber layer are disclosed in Shimazu, U.S. Pat. No. 6,593,055, the disclosure of which is incorporated herein by reference.

To minimize migration of the photothermal conversion material from the underlayer to the top layer during manufacture and storage of the imageable element, the element may comprise a barrier layer between the underlayer and the top layer. The barrier layer comprises a polymeric material that is soluble in the developer. If this polymeric material is different from the polymeric material in the underlayer, it is preferably soluble in at least one organic solvent in which the polymeric material in the underlayer is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer. Imageable elements that comprise a barrier layer are disclosed in Patel, U.S. Pat. No. 6,723,490, the disclosure of which is incorporated herein by reference.

Substrate

The substrate comprises a support, which may be any material conventionally used to prepare imageable elements useful as lithographic printing plates. The support is preferably strong, stable, and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces improve adhesion to subsequent layers. The nature of this layer or layers depends upon the substrate and the composition of subsequent layer or layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

When the substrate comprises a sheet of aluminum or an aluminum alloy, it should be of sufficient thickness to sustain the wear from printing and thin enough to wrap around a cylinder in a printing press, typically about 100 $\mu$m to about 600 $\mu$m. It is typically cleaned, roughened, and anodized by various methods known in the art. Initially, a degreasing treatment with a surfactant, an organic solvent, or an alkaline water solution is typically administered to the remove oil and grease from the surface of the sheet. Then the surface may be roughened by well known techniques, such as mechanical roughening, for example ball polishing; brush polishing; blast polishing and buff polishing; chemical roughening in which the surface is roughened by selectively dissolving the surface; or electrochemical roughening; or a combination of such chemical, mechanical, and/or electrochemical treatments (multi-graining). Etching of the substrate is performed using hot acidic (such as sulfuric or phosphoric) solutions or alkaline solutions (such as sodium hydroxide or trisodium phosphate mixed with sodium hydroxide). Anodic oxidation may be carried out to form a hydrophilic layer of aluminum oxide of the surface, typically a layer of aluminum oxide at least 0.3 $g/m^2$ in weight. Anodic oxidation is performed by passing a current using the support as an anode in an electrolytic solution comprising an electrolyte, such as, for example, sulfuric acid, phosphoric acid, chromic acid, boric acid, citric acid, oxalic acid, or a mixture thereof. Anodic oxidation is disclosed, for example, in Fromson, U.S. Pat. No. 3,280,734, and Chu, U.S. Pat. No. 5,152,158.

Then, the cleaned, roughened, and anodized support may hydrophilized with an alkali metal silicate, such as aqueous potassium silicate, lithium silicate, or, typically, sodium silicate. Hydrophilization is described, for example, in Jewett, U.S. Pat. No. 2,714,066, and Fromson, U.S. Pat. No. 3,181,461. The support is either immersed in or electrolyzed in an aqueous solution of the alkali metal silicate.

Typically, the substrate comprises an interlayer between the aluminum support and the overlying layer or layers. The interlayer may be formed by treatment of the aluminum support with, for example, silicate, dextrine, hexafluorosilicic acid, phosphate/fluoride, polyvinyl phosphonic acid (PVPA), vinyl phosphonic acid co-polymers, or a water-soluble diazo resin. Co-polymers that comprise (1) phosphonic acid groups and/or phosphate groups, and (2) acid groups and/or groups that comprise alkylene glycol or polyalkylene glycol side chains, which are useful as interlayer materials, are also disclosed in U.S. patent application Ser. No. 10/922,782, filed Aug. 20, 2004, the disclosure of which are incorporated herein by reference. Co-polymers that comprise (1) acid groups and/or phosphonic acid groups, and (2) silyl groups substituted with three alkoxy and/or phenoxy groups, useful as interlayer material, are disclosed in U.S. patent application Ser. No. 10/928,339, filed Aug. 27, 2004, the disclosure of which are incorporated herein by reference.

The back side of the support (i.e., the side opposite the top layer and the underlayer) may be coated with an antistatic agent and/or a slipping layer or matte layer to improve handling and "feel" of the imageable element.

Single Layer Imageable Element

In another aspect, the invention is a method of forming an image by thermally imaging and developing an imageable element comprising the top layer over the substrate. The underlayer may or may not be present in the imageable element. The imageable element comprises a photothermal conversion material.

Single layer imageable elements do not comprise the underlayer. The top layer is either on the substrate or the element consists of the substrate, an absorber layer, and the top layer. The element comprises a photothermal conversion material, which is either in the top layer and/or in the absorber layer. The top layer is ink receptive. Before thermal imaging, the top layer is not removable by an alkaline developer, but after thermal imaging the imaged regions of the top layer are removable by the developer. The top layer, the absorber layer, the substrate, and the photothermal conversion material are each as described above.

Preparation of the Imageable Element

The terms "solvent" and "coating solvent" include mixtures of solvents. These terms are used although some or all of the materials may be suspended or dispersed in the solvent rather than in solution. Selection of coating solvents depends on the nature of the components present in the various layers. The imageable element may be prepared by sequentially applying the underlayer, if present, over the hydrophilic surface of the substrate; applying the absorber layer or the barrier layer if present, over the underlayer; and then applying the top layer using conventional techniques.

If present, the underlayer may be applied by any conventional method, such as coating or lamination. Typically the ingredients are dispersed or dissolved in a suitable coating solvent, and the resulting mixture coated by conventional methods, such as spin coating, bar coating, gravure coating, die coating, or roller coating. The underlayer may be applied, for example, from mixtures of methyl ethyl ketone, 1-methoxypropan-2-ol, γ-butyrolactone, and water; from mixtures of diethyl ketone, water, methyl lactate, and γ-butyrolactone; and from mixtures of diethyl ketone, water, and methyl lactate.

Preparation of imageable elements that comprise a barrier layer is disclosed in Patel, U.S. Pat. No. 6,723,490, the disclosure of which is incorporated herein by reference. Preparation of imageable elements that comprise an absorber layer is disclosed in Shimazu, U.S. Pat. No. 6,593,055, the disclosure of which is incorporated herein by reference. When neither a barrier layer nor an absorber layer is present, the top layer is coated on the underlayer. To prevent the underlayer from dissolving and mixing with the top layer, the top layer should be coated from a solvent in which the underlayer is essentially insoluble. Thus, the coating solvent for the top layer should be a solvent in which the components of the top layer are sufficiently soluble that the top layer can be formed and in which any underlying layers are essentially insoluble. Typically, the solvents used to coat the underlying layers are more polar than the solvent used to coat the top layer. The top layer may be applied, for example, from diethyl ketone, or from mixtures of diethyl ketone and 1-methoxy-2-propyl acetate. An intermediate drying step, i.e., drying the underlayer to remove coating solvent before coating the top layer over it, may also be used to prevent mixing of the layers.

Alternatively, the underlayer, the top layer, or both layers may be applied by conventional extrusion coating methods from a melt mixture of layer components. Typically, such a melt mixture contains no volatile organic solvents.

When the element does not comprise an underlayer, an absorber layer, or a barrier layer, the top layer is coated directly onto the substrate.

Imaging and Processing

The imageable elements may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada), the Screen PlateRite model 4300, model 8600, and model 8800

(Screen, Rolling Meadows, Chicago, Ill., USA), and the Gerber Crescent 42T (Gerber Systems, South Windsor, Conn., USA).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers, the GS618–400 thermal plotter (Oyo Instruments, Houston, Tex., USA), or the Model VP-3500 thermal printer (Seikosha America, Mahwah, N.J., USA).

Imaging produces an imaged element, which comprises a latent image of imaged (exposed) regions and complementary unimaged (unexposed) regions. Development of the imaged element to form a printing plate, or printing form, converts the latent image to an image by removing the imaged regions, revealing the hydrophilic surface of the underlying substrate.

The developer may be any liquid or solution that can penetrate and remove the imaged regions of the top layer, the underlying regions of, if present, the absorber layer or barrier layer, and the underlying regions of the underlayer without substantially affecting the complimentary unimaged regions. Development is carried out for a long enough time to remove the imaged regions of the top layer, the underlying regions of, if present, the absorber layer or barrier layer, and the underlying regions of the underlayer in the developer, but not long enough to remove the unimaged regions of the top layer. Hence, the imaged regions are described as being “soluble” or “removable” in the developer because they are removed, and dissolved and/or dispersed, more rapidly in the developer than the unimaged regions. Typically, the underlayer is dissolved in the developer, the absorber layer is either dissolved or dispersed in the developer, and the top layer is dispersed in the developer.

Solvent-based alkaline developers, which are typically used with negative working imageable elements, are excellent developers for use with the imageable elements of this invention. Solvent-based developers comprise an organic solvent or a mixture of organic solvents. The developer is a single phase. Consequently, the organic solvent must be miscible with water, or at least soluble in the developer to the extent it is added to the developer, so that phase separation does not occur. The following solvents and mixtures of these solvents are suitable for use in the developer: the reaction products of phenol with ethylene oxide and propylene oxide, such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethylethanol and 2-butoxyethanol. A single organic solvent or a mixture of organic solvents can be used. The organic solvent is typically present in the developer at a concentration of between about 0.5 wt % to about 15 wt %, based on the weight of the developer, preferably between about 3 wt % and about 5 wt %, based on the weight of the developer. Useful commercially available solvent-based developers include ND-1 Developer, 956 Developer, and 955 Developer (Kodak Polychrome Graphics, Norwalk, Conn., USA.). Other useful developers include aqueous solutions having a pH of about 7 or above. Typical aqueous alkaline developers are those that have a pH between about 8 and about 13.5, typically at least about 11, preferably at least about 12. Useful commercially available aqueous alkaline developers include 3000 Developer and 9000 Developer (Kodak Polychrome Graphics, Norwalk, Conn., USA).

The developer may also comprise a surfactant or a mixture of surfactants. Preferred surfactants include: alkali metal salts of alkyl naphthalene sulfonates; alkali metal salts of the sulfate monoesters of aliphatic alcohols, typically having six to nine carbon atoms; and alkali metal sulfonates, typically having six to nine carbon atoms. A preferred alkali metal is sodium. The surfactant or mixture of surfactants typically comprises about 0.5 wt % to about 15 wt % based on the weight of the developer, preferably about 3 wt % to about 8 wt %, based on the weight of the developer. The developer may also comprise a buffer system to keep the pH relatively constant, typically between about 5.0 and about 12.0, preferably between about 6.0 and about 11.0, more preferably between about 8.0 and about 10.0. Numerous buffer systems are known to those skilled in the art. Typically buffer systems include, for example: combinations of water-soluble amines, such as mono-ethanol amine, diethanol amine, tri-ethanol amine, or tri-1-propyl amine, with a sulfonic acid, such benzene sulfonic acid or 4-toluene sulfonic acid; mixtures of the tetra sodium salt of ethylene diamine tetracetic acid (EDTA) and EDTA; mixtures of phosphate salts, such as mixtures of mono-alkali phosphate salts with tri-alkali phosphate salts; and mixtures of alkali borates and boric acid. Water typically comprises the balance of the developer.

The developer is typically applied to the precursor by spraying the element with sufficient force to remove the exposed regions. Alternatively, development may carried out in a processor equipped with an immersion-type developing bath, a section for rinsing with water, a gumming section, a drying section, and a conductivity-measuring unit, or the imaged precursor may be brushed with the developer. In each instance, a printing plate is produced. Development may conveniently be carried out in a commercially available spray-on processor, such as an 85 NS (Kodak Polychrome Graphics).

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example cellulose, polyvinylalcohol, polymethacrylic acid, polymethacrylamide, polyvinylmethylether, polyhydroxyethylmethacrylate, gelatin, and polysaccharide such as dextran, pullulan, gum arabic, and alginic acid. A preferred material is gum arabic.

A developed and gummed plate may also be baked to increase the run length of the plate. Baking can be carried out, for example at about 220° C. to about 240° C. for about 7 minutes to 10 minutes, or at a temperature of 120° C. for 30 minutes.

INDUSTRIAL APPLICABILITY

The imageable elements of the invention have excellent resistance to press room chemicals such as glycol ethers and diacetone alcohol, good developer resistance, and good humidity shelf life. They can be thermally imaged and developed with an aqueous alkaline developer to form lithographic printing plates. Once the imageable element has been imaged and developed to form a lithographic printing plate, printing can then be carried out by applying a fountain solution and then lithographic ink to the image on its surface. The fountain solution is taken up by the surface of the hydrophilic substrate revealed by the imaging and development process, and the ink is taken up by the regions of the layer or layers not removed by the development process. The ink is then transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

Glossary

| | |
|---|---|
| 956 Developer | Solvent based (phenoxyethanol) alkaline negative developer (Kodak Polychrome Graphics, Norwalk, CT, USA) |
| AIBN | 2,2'-Azobisisobutyronitrile (DuPont, Wilmington, Delaware, USA) |
| BC | 2-Butoxyethanol |
| BYK-307 | Polyethoxylated dimethylpolysiloxane copolymer (BYK Chemie, Wallingford, CT, USA) |
| CREO ® Trendsetter 3244x | Commercially available platesetter, using Procom Plus software and having a laser diode array emitting at 830 nm (Creo Products, Burnaby, BC, Canada) |
| DAA | Diacetone alcohol (4-hydroxy-4-methyl-2-pentanone) |
| Developer A | 1 part ND1 negative developer and 4 parts water |
| DUREZ ® 33816 | Novolac resin, 70% m-cresol/30% p-cresol; MW 45,000, manufactured by solvent condensation (Durez, Grand island, NY, USA) |
| Ethyl violet | C.I. 42600; CAS 2390-59-2 ($lambda_{max}$ = 596 nm) [$(p-(CH_3CH_2)_2NC_6H_4)_3C^+$ $Cl^-$] (Aldrich, Milwaukee, WI, USA) |
| Electra Excel ™ | Thermally sensitive, positive working, single layer, conditioned, inhibited novolac-containing plate printing plate precursor (Kodak Polychrome Graphics, Norwalk, CT, USA). |
| Goldstar ™ Developer | Sodium metasilicate based aqueous alkaline developer (Kodak Polychrome Graphics, Norwalk, CT, USA) |
| IR Dye A | Infrared absorbing dye ($lambda_{max}$ = 830 nm) (Eastman Kodak, Rochester, NY, USA) (see structure above) |
| IR Dye C | 2-[2-[2-Chloro-3-[(1,3-dihydro-1,3,3-trimethyl-2H-indol-2-ylidene)ethylidene]-1-cyclohexen-1-yl]ethenyl]-1,3,3,-trimethyl-3H-iodonium bromide (Honeywell Specialty Chemicals, Morristown, NJ. USA) |
| LB-6564 | Phenol/cresol novolac resin (Bakelite AG, Southampton, UK) |
| ND-1 Developer | Negative developer (Kodak Polychrome Graphics, Norwalk, CT, USA) |
| Polymer 1 | Copolymer of N-phenylmaleimide (41.5 mol %), methacrylamide (37.5 mol %), and methacrylic acid (21 mol %) |
| SILIKOPHEN ® P50X | Phenylmethyl polysiloxane resin (Tego Chemie Service, Essen, Germany) |
| Substrate A | 0.3 mm gauge, aluminum sheet which had been electrograined, anodized and treated with a solution of polyvinyl phosphonic acid |
| Substrate B | 0.3 mm gauge, aluminum sheet which had been electrograined, anodized and treated with a solution of inorganic phosphate |
| SWORD ® Excel ™ | Thermally sensitive, positive working, multi-layer, printing plate precursor (Kodak Polychrome Graphics, Norwalk, CT, USA) |
| XDSA | 1,3-dimethyl-4,6-benzene disulfonanilide |

Evaluation Procedures

Developer Drop Test A large drop of developer was placed on the surface of the top layer at 30 sec intervals at 22° C. up to 5 min. The time of the first visible signs of attack and the time to completely remove the top layer were recorded.

Solvent Resistance Drop Test A large drop of either 2-butoxyethanol (Butyl CELLOSOLVE®) (80 vol % in water) or diacetone alcohol (80 vol % in water) was placed on the surface of the top layer at 2 min intervals at 22° C. up to 16 min. The time at which damage to the top layer occurred was observed. The amount of the top layer removed as assessed (1=no removal; 10=complete removal).

Imaging and Processing Tests The imageable elements were thermally imaged on a CREO® Trendsetter 3244 at 8 watts using plot 0 and plot 12 internal test patterns. The imaging energies were 136,115,100, 88, and 79 mJ/$cm^2$. The resulting imaged imageable elements were developed at 30° C. in a PK91011 processor (Kodak Polychrome Graphics, Norwalk, Conn., USA) using Developer A and an immersion time of 12 sec. The resulting lithographic printing plates were evaluated for cleanout (lowest imaging energy at which the imaged regions are completely removed by the developer), and best resolution (imaging energy at which printing plate performs best).

Example 1

Maleic anhydride (20.41 g), norbornene (19.59 g), and dry dioxolane (136 g) were added to a 500 ml reaction kettle equipped with a heating mantle, stirrer, thermometer, and condenser. The mixture was heated to 60° C. under a nitrogen atmosphere, and nitrogen bubbled through the mixture for 1 h through a nitrogen inlet tube. Then the nitrogen inlet tube was removed from the solution and AIBN (0.3 g) was added. The reaction mixture was heated at 60° C. for an additional 24 h under a nitrogen atmosphere.

The reaction mixture was cooled and poured into 2 L of diethylether/hexane (50/50 volume to volume). The co-polymer was filtered off, washed several times with diethylether/hexane, and dried for 48 h at 50° C. Yield: 25 g (62.5%).

The co-polymer is believed to have the following structure:

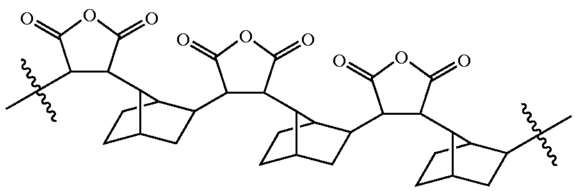

Example 2

The procedure of Example 1 was repeated with N-phenyl maleimide (25.91 g) and norbonene (14.09 g). After addition of the AIBN, heating at 60° C. was continued for 20 h. Yield: 19.0 g (47.5%).

The co-polymer is believed to have the following structure:

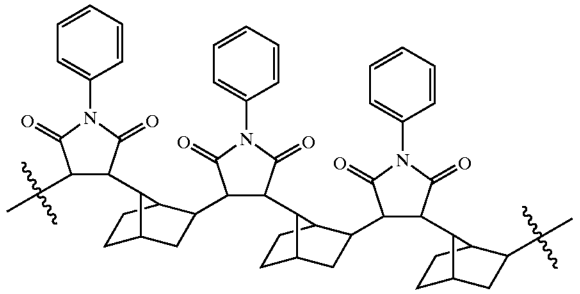

Example 3

An imageable element was prepared by the following procedure.

Underlayer: A coating solution containing 6.5 wt % of a mixture of 84.5 wt % of Polymer 1,15 wt % of IR Dye A, and 0.5 wt % of BYK 307 in a mixture of 2-butanone/1-methoxy-2-propanol/gamma-butyrolactone/water (65:15:10:10 by weight) was coated onto Substrate A using a 0.03 in wire wound bar, and the resulting element dried at 135° C. for 35 sec. Coating weight of the underlayer: 1.5 g/m$^2$.

Top layer: A coating solution containing 7.1 wt % of a mixture of 99.1 wt % of the co-polymer formed in Example 1, 0.4 wt % of ethyl violet, and 0.5 wt % of BYK 307 in diethylketone/1-methoxy-2-propanol acetate was coated onto the underlayer using a 0.015 cm (0.006 in) wire wound bar, and the resulting imageable element dried at 135° C. for 35 sec. Coating weight of the top layer: 0.7 g/m$^2$.

Example 4

The procedure of Example 3 was repeated except that the co-polymer formed in Example 2 was used in the top layer instead of the co-polymer formed in Example 1.

Example 5

The imageable elements prepared in Examples 3 and 4 were evaluated in the Developer Drop Test with Developer A, the Solvent Resistance Drop Test, and the Imaging and Processing Test. The results are given in Tables 1, 2, and 3. A SWORD® Excel™ lithographic printing plate precursor was used for comparison.

TABLE 1

| | Developer Drop Tests (sec) | | Imaging (mJ/cm$^2$) | |
|---|---|---|---|---|
| Example | First Attack | Top Layer Removed | Cleanout | Best Resolution |
| 3 | 120 | >300 | 88 | 115 |
| 4 | 90 | >300 | 79 | 115 |
| SWORD ® Excel ™ | 180 | >300 | 79 | 115 |

TABLE 2

| | BC/water (80:20) Drop Test | | | | |
|---|---|---|---|---|---|
| Example | 2 min | 4 min | 6 min | 8 min | 16 min |
| 3 | 1 | 1 | 1 | 1 | 1 |
| 4 | 1 | 1 | 1 | 1 | 1 |
| SWORD ® Excel ™ | 10 | 10 | 10 | 10 | 10 |

TABLE 3

| | DAA/water (80:20) Drop Test | | | | |
|---|---|---|---|---|---|
| Example | 2 min | 4 min | 6 min | 8 min | 16 min |
| 3 | 1 | 1 | 1 | 1 | 2 |
| 4 | 1 | 1 | 2 | 3 | 4 |
| SWORD ® Excel ™ | 10 | 10 | 10 | 10 | 10 |

Example 6

The imageable elements prepared in Example 3 were placed in a humidity chamber at 40° C. and 80% relative humidity for 0, 1, 3, or 5 days and evaluated as described in Example 5. The results are shown in Tables 4, 5, and 6.

TABLE 4

| | Developer Drop Tests (sec) | | Imaging (mJ/cm$^2$) | |
|---|---|---|---|---|
| Humidity (days) | First Attack | Top Layer Removed | Cleanout | Best Resolution |
| 0 | 120 | >300 | 88 | 115 |
| 1 | 150 | >300 | 79 | 115 |
| 3 | 150 | >300 | 79 | 115 |
| 5 | 150 | >300 | 79 | 115 |

TABLE 5

| | BC/water (80:20) Drop Test | | | | |
|---|---|---|---|---|---|
| Humidity (days) | 2 min | 4 min | 6 min | 8 min | 16 min |
| 0 | 1 | 1 | 1 | 1 | 1 |
| 1 | 1 | 1 | 1 | 1 | 1 |
| 3 | 1 | 1 | 1 | 1 | 1 |
| 5 | 1 | 1 | 1 | 1 | 1 |

TABLE 6

| | DAA/water (80:20) Drop Test | | | | |
|---|---|---|---|---|---|
| Humidity (days) | 2 min | 4 min | 6 min | 8 min | 16 min |
| 0 | 1 | 1 | 1 | 1 | 2 |
| 1 | 1 | 1 | 1 | 2 | 2 |
| 3 | 1 | 1 | 2 | 2 | 3 |
| 5 | 1 | 1 | 2 | 2 | 3 |

Example 7

The imageable element prepared in Example 3 was evaluated in the Developer Drop Test using 956 Developer. It was also evaluated in the Imaging and Processing Test, except that imaging was carried out at 126, 119, 105, 100, 95, 90, 86, 82, and 79 $mJ/cm^2$ and the imaged imageable elements were developed in 956 Developer at a processing speed of 3.5 ft/min. Results are:

| | |
|---|---|
| Drop Test with 956 Developer | 120 sec |
| Cleanout | 79 $mJ/cm^2$ |
| Best Resolution | 105 $mJ/cm^2$ |

Example 8

SWORD® Excel™ imageable elements and the imageable elements produced in Example 3 were each cut in to four 4 in diameter disks using a punch. Each disk was weighed and then immersed into BC/water (80/20 by volume for 1 min), rinsed, dried, in an oven at 150° C. for 30 min, cooled 10 min, and re-weighed. Each disc was then placed in an oven at 550° C. for 1 h to remove the top layer and underlayer, cooled for 10 min, and weighed. The percentage of the top layer and underlayer removed by soaking in BC/water (80:20) was calculated.

The test was repeated by soaking in BC/water (80:20) for 2, 4, 8 and 16 min. The test was repeated by soaking in DAA/water (80:20) for 1, 2, 4, 8 and 16 min. The results are shown in Table 7.

TABLE 6

| | AMOUNT REMAINING AFTER SOAKING (%) | | | |
|---|---|---|---|---|
| Soak Time (Min) | Example 3 BC/Water 80/20 | SWORD ® Excel ™ BC/Water 80/20 | Example 3 DAA/Water 80/20 | SWORD ® Excel ™ DAA/Water 80/20 |
| 0 | 100.00 | 100.00 | 100.00 | 100.00 |
| 1 | 100.34 | 70.94 | 101.14 | 71.29 |
| 2 | 100.34 | 70.46 | 100.33 | 69.35 |
| 4 | 100.60 | 69.61 | 100.33 | 63.78 |
| 8 | 100.33 | 64.24 | 99.80 | 56.61 |
| 16 | 101.13 | 55.70 | 99.27 | 39.43 |

The SWORD® Excel™ imageable element lost about 29% of the top layer and the underlayer in 1 min, which corresponds to a loss of the top layer. The additional gradual weight loss was due to loss of the more solvent resistant underlayer. The imageable elements prepared in Example 3 were resistant to both BC/water (20:20) and DAA/water (20:20).

Example 9

This example illustrates a single layer printing plate precursor. A coating solution containing the following ingredients (wt % based on total solids in the composition) was prepared in 2-butanone/1-methoxypropan-2-ol/gamma-butyrolactone/water (65:15:10:10): 37.7 wt % LB-6564; 31.5 wt % DUREZ®) 33816; 16.9 wt % of the co-polymer of Example 1; 1.45 wt % of IR Dye A; 0.45 wt % of IR Dye C, 3.9 wt % XDSA; 1.9 wt % ethyl violet; 5.8 wt % SILIKOPHEN® P50X; and 0.4 wt % BYK-307. The coating solution was coated onto Substrate B with a wire wound bar, and dried at 100° C. for 90 sec. Coating weight of the top layer: 1.5 $g/m^2$.

The resulting single layer imageable element and an Electra Excel™ single layer imageable element were imaged at 120, 130, 140, 150, 160, 170, and 180 $mJ/cm^2$ imaging energies using the CREO® Trendsetter. The resulting imaged imageable elements were processed in a MERCURY® Mark V immersion processor (Kodak Polychrome Graphics, Norwalk, Conn., USA) containing Goldstar™ developer at 23.0° C. at a processing speed of 750 mm/min.

Images produced were evaluated with a Gretag MacBeth D19C densitometer (Gretag Macbeth Color Data Systems, The Wirral, UK). Results are shown in Table 7. Decrease in optical density is a measure of the amount of the top layer lost during the developing process. Both imageable elements have about the same amount of decrease in optical density during development. However, the imageable element of the invention shows only a very small loss in optical density when submersed in a fountain solution for 24 h.

TABLE 7

| | Speed[a] ($mJ/cm^2$) | Optical Density[b] | Developer Resistance[c] | Solvent Resistance[d] |
|---|---|---|---|---|
| Example 9 | 150 | 1.25 | −0.16 | −0.01 |
| Electra Excel ™ | 140 | 1.22 | −0.14 | −0.89 |

[a]Imaging energy at which the best resolution was observed.
[b]Optical density of the printing plate.
[c]Change in optical density of the non-imaged regions during processing.
[d]Change in optical density when the printing plate is submersed in a fountain solution for 24 h. The fountain solution contained 10 wt % i-propyl alcohol, 6 wt % Astro Mark II (BW Darrah, St. Charles, IL, USA), and 84% deionized water.

Having described the invention, we now claim the following and their equivalents.

What is claimed is:

1. An imageable element comprising:

a substrate, an underlayer over the substrate, and a top layer over the underlayer; in which:

the element comprises a photothermal conversion material;

the top layer is ink receptive;

before thermal imaging, the top layer is not removable by an alkaline developer;

after thermal imaging to form imaged regions in the top layer, the imaged regions are removable by the alkaline developer;

the underlayer is removable by the alkaline developer, and the top layer comprises a co-polymer selected from the group consisting of co-polymers that comprise, in polymerized form, a monomer of group (a) and a monomer of group (b), in which:

the monomer of group (a) is selected from the group consisting of:

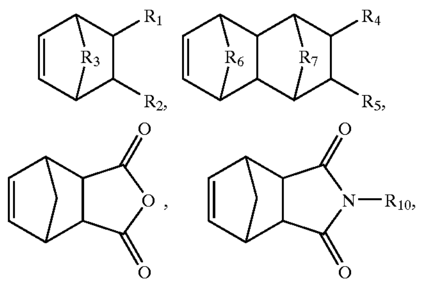

and mixtures thereof;

the monomer of group (b) is selected from the group consisting of:

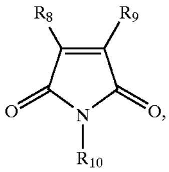, 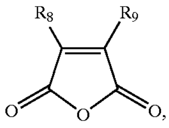, acrylonitrile, methacrylonitrile, styrene, hydroxystyrene, $CH(R_{11})CH(CO_2R_{12})$, $CH(R_{11})CH(CON(R_{12})_2)$, $CH_2CH(OR_{12})$, and mixtures thereof;

$R_1$, $R_2$, $R_4$, and $R_5$ are each independently hydrogen, phenyl, substituted phenyl, halogen, alkyl of 1 to 6 carbon atoms, alkoxyl of 1 to 6 carbon atoms, acyl of 1 to 7 carbon atoms, acyloxy of 1 to 7 carbon atoms, carboalkoxy of 1 to 7 carbon atoms, or a mixture thereof;

$R_3$, $R_6$, and $R_7$ are each —$CH_2$—;

each $R_8$ and $R_9$ is each independently hydrogen or methyl, or a mixture thereof;

each $R_{10}$ is hydrogen, hydroxyl, alkyl of 1 to 6 carbon atoms, phenyl, substituted phenyl, benzyl, or a mixture thereof; and each $R_{11}$ is hydrogen, methyl, or a mixture thereof;

each $R_{12}$ is hydrogen, alkyl of 1 to 6 carbon atoms, phenyl, substituted phenyl, or a mixture thereof; and the co-polymer comprises at least about 15 mol % of the monomer of group (a), and at least about 10 mol % of the monomer of group (b).

2. The element of claim 1 in which:

the monomer of group (b) is selected from the group consisting of:

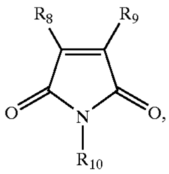, 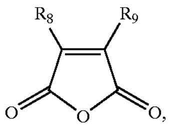, and mixtures thereof; and the top layer comprises at least 90 wt % of the co-polymer.

3. The element of claim 1 in which the top layer is substantially free of the photothermal conversion material.

4. The element of claim 3 in which the monomer of group (a) is selected from the group consisting norbornene, tetracyclododecene, and mixtures thereof, and the monomer of group (b) is selected from the group consisting of maleic anhydride, maleimide, N-phenyl maleimide, N-benzyl maleimide, N-cyclohexyl maleimide, and mixtures thereof.

5. The element of claim 4 in which the monomer of group (a) is norbornene.

6. The element of claim 1 in which the co-polymer is an about 1:1 co-polymer of norbornene and a monomer selected from the group consisting of maleic anhydride, maleimide, N-phenyl maleimide, N-benzyl maleimide, N-cyclohexyl maleimide, and mixtures thereof.

7. The element of claim 6 in which the top layer is substantially free of the photothermal conversion material, and the underlayer comprises a polymeric material that comprises, in polymerized form, about 25 to about 75 mol % of N-phenylmaleimide; about 10 to about 50 mol % of methacrylamide; and about 5 to about 30 mol % of methacrylic acid; and the top layer comprises at least 90 wt % of the co-polymer.

8. A method for forming an image, the method comprising the steps of:

(i) thermally imaging an imageable element comprising a substrate and a top layer over the substrate; and forming an imaged imageable element comprising imaged regions and complementary unimaged regions in top layer;

in which:

the element comprises a photothermal conversion material;

the top layer is ink receptive;

before thermal imaging, the top layer is not removable by an alkaline developer;

after thermal imaging to form imaged regions in the top layer, the imaged regions are removable by the alkaline developer; and the top layer comprises a co-polymer selected from the group consisting of co-polymers that comprise, in polymerized form, a monomer of group (a) and a monomer of group (b), in which:

the monomer of group (a) is selected from the group consisting of:

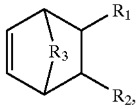, 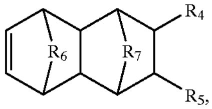,

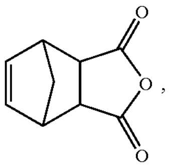, 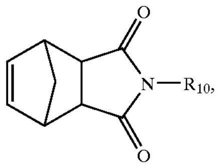, and mixtures thereof;

the monomer of group (b) is selected from the group consisting of:

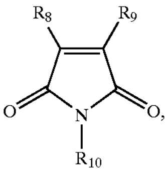, 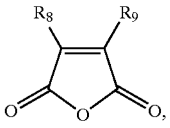, acrylonitrile, methacrylonitrile, styrene, hydroxystyrene, $CH(R_{11})CH(CO_2R_{12})$, $CH(R_{11})CH(CON(R_{12})_2)$, $CH_2CH(OR_{12})$, and mixtures thereof;

$R_1$, $R_2$, $R_4$, and $R_5$ are each independently hydrogen, phenyl, substituted phenyl, halogen, alkyl of 1 to 6 carbon atoms, alkoxyl of 1 to 6 carbon atoms, acyl of 1 to 7 carbon atoms, acyloxy of 1 to 7 carbon atoms, carboalkoxy of 1 to 7 carbon atoms, or a mixture thereof;

$R_3$, $R_6$, and $R_7$ are each —$CH_2$—;

each $R_8$ and $R_9$ is each independently hydrogen or methyl, or a mixture thereof;

each $R_{10}$ is hydrogen, hydroxyl, alkyl of 1 to 6 carbon atoms, phenyl, substituted phenyl, benzyl, or a mixture thereof; and each $R_{11}$ is hydrogen, methyl, or a mixture thereof;

each $R_{12}$ is hydrogen, alkyl of 1 to 6 carbon atoms, phenyl, substituted phenyl, or a mixture thereof; and the co-polymer comprises at least about 15 mol % of the monomer of group (a), and at least about 10 mol % of the monomer of group (b); and (ii) forming the image by developing the imaged imageable element with the alkaline developer and removing the imaged regions.

9. The method of claim 8 in which the top layer is on the substrate and the top layer comprises the photothermal conversion material.

10. The method of claim 9 in which:

the monomer of group (b) is selected from the group consisting of:

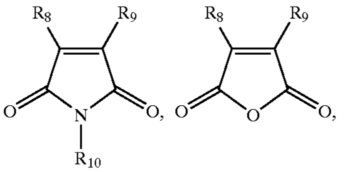

and mixtures thereof; and the top layer comprises at least 90 wt % of the co-polymer.

11. The method of claim 9 in which the monomer of group (a) is selected from the group consisting norbornene, tetracyclododecene, and mixtures thereof, and the monomer of group (b) is selected from the group consisting of maleic anhydride, maleimide, N-phenyl maleimide, N-benzyl maleimide, N-cyclohexyl maleimide, and mixtures thereof.

12. The method of claim 11 in which the monomer of group (a) is norbornene.

13. The method of claim 12 in which the co-polymer is an about 1:1 co-polymer of norbornene and a monomer selected from the group consisting of maleic anhydride, maleimide, N-phenyl maleimide, N-benzyl maleimide, N-cyclohexyl maleimide, and mixtures thereof; and the top layer comprises at least 90 wt % of the co-polymer.

14. The method of claim 8 in which the element additionally comprises an underlayer between the top layer and the substrate; and the underlayer is removable by the alkaline developer.

15. The method of claim 14 in which the top layer is substantially free of the photothermal conversion material, and the underlayer is on the substrate.

16. The method of claim 15 in which:

the monomer of group (b) is selected from the group consisting of:

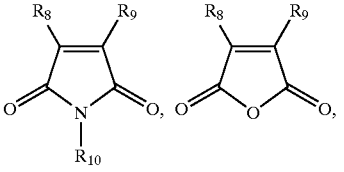

and mixtures thereof; and the top layer comprises at least 90 wt % of the co-polymer.

17. The method of claim 15 in which the monomer of group (a) is selected from the group consisting norbornene, tetracyclododecene, and mixtures thereof, and the monomer of group (b) is selected from the group consisting of maleic anhydride, maleimide, N-phenyl maleimide, N-benzyl maleimide, N-cyclohexyl maleimide, and mixtures thereof.

18. The method of claim 17 in which the monomer of group (a) is norbornene.

19. The method of claim 15 in which the co-polymer is an about 1:1 co-polymer of norbornene and a monomer selected from the group consisting of maleic anhydride, maleimide, N-phenyl maleimide, N-benzyl maleimide, N-cyclohexyl maleimide, and mixtures thereof.

20. The method of claim 19 in which the underlayer comprises a polymeric material that comprises, in polymerized form, about 25 to about 75 mol % of N-phenylmaleimide; about 10 to about 50 mol % of methacrylamide; and about 5 to about 30 mol % of methacrylic acid; and the top layer comprises at least 90 wt % of the co-polymer.

21. An image prepared by a method comprising the steps of:

(i) thermally imaging an imageable element comprising a substrate and a top layer over the substrate; and forming an imaged imageable element comprising imaged regions and complementary unimaged regions in top layer;

in which:

the element comprises a photothermal conversion material;

the top layer is ink receptive;

before thermal imaging, the top layer is not removable by an alkaline developer;

after thermal imaging to form imaged regions in the top layer, the imaged regions are removable by the alkaline developer; and the top layer comprises a co-polymer selected from the group consisting of co-polymers that comprise, in polymerized form, a monomer of group (a) and a monomer of group (b), in which:

the co-polymer comprises at least about 15 mol % of the monomer of group (a), and at least about 10 mol % of the monomer of group (b);

the element additionally comprises an underlayer between the top layer and the substrate;

the underlayer is removable by the alkaline developer;

underlayer is on the substrate;

the top layer is substantially free of the photothermal conversion material;

the monomer of group (a) is norbornene;

the monomer of group (b) is selected from the group consisting of maleic anhydride, maleimide, N-phenyl maleimide, N-benzyl maleimide, N-cyclohexyl maleimide, and mixtures thereof; and the top layer comprises at least 90 wt % of the co-polymer; and (ii) forming the image by developing the imaged imageable element with the alkaline developer and removing the imaged regions.

22. The image of claim 21 in which the underlayer comprises a polymeric material that comprises, in polymerized form, about 25 to about 75 mol % of N-phenylmaleimide; about 10 to about 50 mol % of methacrylamide; and about 5 to about 30 mol % of methacrylic acid.

* * * * *